United States Patent
Dunn et al.

(10) Patent No.: US 7,952,141 B2
(45) Date of Patent: May 31, 2011

(54) SHIELD CONTACTS IN A SHIELDED GATE MOSFET

(75) Inventors: Dixie Dunn, Salt Lake City, UT (US);
Paul Thorup, West Jordan, UT (US);
Dean E. Probst, West Jordan, UT (US);
Michael D. Gruenhagen, Salt Lake City, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/509,379

(22) Filed: Jul. 24, 2009

(65) Prior Publication Data
US 2011/0018059 A1    Jan. 27, 2011

(51) Int. Cl.
*H01L 29/78*    (2006.01)
(52) U.S. Cl. .................... 257/334; 257/E29.262
(58) Field of Classification Search .......... 257/330–335, 257/E29.262
See application file for complete search history.

(56) References Cited

U.S. PATENT DOCUMENTS

| | | | |
|---|---|---|---|
| 6,351,018 B1 | 2/2002 | Sapp | |
| 6,621,107 B2 | 9/2003 | Blanchard et al. | |
| 6,653,691 B2 | 11/2003 | Baliga | |
| 6,683,346 B2 | 1/2004 | Zeng | |
| 6,750,508 B2 | 6/2004 | Omura et al. | |
| 6,891,223 B2 | 5/2005 | Krumrey et al. | |
| 7,345,342 B2 | 3/2008 | Challa et al. | |
| 7,446,374 B2 | 11/2008 | Thorup et al. | |
| 7,449,354 B2 * | 11/2008 | Marchant et al. ............... 438/39 |
| 7,514,322 B2 | 4/2009 | Yilmaz et al. | |
| 2005/0032291 A1 | 2/2005 | Baliga | |
| 2005/0167742 A1 * | 8/2005 | Challa et al. .................. 257/328 |
| 2006/0170036 A1 | 8/2006 | Yilmaz | |
| 2006/0209887 A1 | 9/2006 | Bhalla et al. | |
| 2007/0194374 A1 * | 8/2007 | Bhalla et al. .................. 257/330 |

(Continued)

FOREIGN PATENT DOCUMENTS

EP    1170803 A2    9/2002

OTHER PUBLICATIONS

International Search Report of the International Searching Authority for Application No. PCT/US20108/042649, mailed on Feb. 25, 2011, 6 pages.

(Continued)

*Primary Examiner* — Nathan W Ha
(74) *Attorney, Agent, or Firm* — Kilpatrick Townsend & Stockton LLP

(57) ABSTRACT

A semiconductor structure comprises an active region comprising trenches extending into a semiconductor region. Each trench includes a shield electrode and a gate electrode. The semiconductor structure also comprises a shield contact region adjacent to the active region. The shield contact region comprises at least one contact trench extending into the semiconductor region. The shield electrode from at least one of the trenches in the active region extends along a length of the contact trench. The semiconductor structure also comprises an interconnect layer extending over the active region and the shield contact region. In the active region the interconnect layer is isolated from the gate electrode in each trench by a dielectric layer and contacts mesa surfaces of the semiconductor region adjacent to the trenches. In the shield contact region the interconnect layer contacts the shield electrode and the mesa surfaces of the semiconductor region adjacent to the contact trench.

16 Claims, 8 Drawing Sheets

U.S. PATENT DOCUMENTS

| | | |
|---|---|---|
| 2007/0221952 A1 | 9/2007 | Thorup et al. |
| 2008/0064168 A1 | 3/2008 | Kraft et al. |
| 2008/0197407 A1* | 8/2008 | Challa et al. .................. 257/330 |
| 2009/0206924 A1* | 8/2009 | Zeng et al. ..................... 327/581 |
| 2009/0230465 A1* | 9/2009 | Yilmaz et al. ................. 257/330 |
| 2010/0140689 A1* | 6/2010 | Yedinak et al. ............... 257/330 |

OTHER PUBLICATIONS

Written Opinion of the International Searching Authority for Application No. PCT/US2010//042649, mailed on Feb. 25, 2011, 5 pages.

* cited by examiner

SHIELD CONTACTS IN A SHIELDED GATE MOSFET

BACKGROUND

The present subject matter relates in general to semiconductor power device technology, and in particular to structures and methods for forming shield contacts in shielded gate metal-oxide-semiconductor field effect transistors (MOSFETs).

A typical shielded gate MOSFET die includes an active region with an array of mesas and trenches forming active devices. Shield electrodes are disposed in a bottom portion of the trenches and gate electrodes are disposed in an upper portion of the trenches over the shield electrodes. The active devices are configured to conduct current in an ON-state. The active region is typically surrounded by an inactive interconnect region that is not intended to conduct current. The interconnect region is configured to provide electrical contacts to the gate and shield electrodes in the active region. Typically one or more stripes of conductive material in the interconnect region called gate runners make electrical contact with the gate electrodes in the active region. Each gate runner is electrically connected to a gate pad generally located in the interconnect region. Typically one or more stripes of conductive material called shield runners are disposed parallel to the gate runners in the interconnect region. The shield runners are isolated from the gate runners and make electrical contact with the shield electrodes in the active region. The shield runners are typically coupled to the source conductive layer or to a shield pad.

By positioning the gate and shield runners in the interconnect region, the area in the active region is preserved for active devices. This leads to an increase in gate and shield resistance, however, because contact to the gate and shield electrodes is along the edge of the die in the interconnect region. Thus, there is a need in the art for improved shielded gate MOSFETs with low gate and shield resistance.

SUMMARY

In accordance with an embodiment of the invention, a semiconductor structure comprises an active region comprising trenches extending into a semiconductor region. Each trench includes a shield electrode in a bottom portion of the trench, a gate electrode in an upper portion of the trench over the shield electrode, and an inter-electrode dielectric layer extending between the shield electrode and the gate electrode. The semiconductor structure also comprises a shield contact region adjacent to the active region. The shield contact region comprises at least one contact trench extending into the semiconductor region. The shield electrode from at least one of the trenches in the active region extends along a length of the contact trench. The semiconductor structure also comprises an interconnect layer extending over the active region and the shield contact region. In the active region the interconnect layer is isolated from the gate electrode in each of the trenches by a dielectric layer, and the interconnect layer contacts mesa surfaces of the semiconductor region adjacent to the trenches. In the shield contact region the interconnect layer contacts the shield electrode and the mesa surfaces of the semiconductor region adjacent to the contact trench.

In one embodiment, at least one of the trenches in the active region extends into the shield contact region and is contiguous with the contact trench. In another embodiment, at least one of the trenches in the active region does not extend into the shield contact region.

In another embodiment, each of the trenches in the active region extend in a first direction, and the active region further comprises at least one cross trench extending substantially perpendicular to the trenches. A gate electrode in the cross trench is contiguous with the gate electrode in at least one of the trenches.

In another embodiment, the interconnect layer in the shield contact region contacts the mesa surfaces of the semiconductor region adjacent to the contact trench to form Schottky contacts therebetween.

In another embodiment, the shield contact region comprises a plurality of contact trenches separated by the mesa surfaces of the semiconductor region, and Schottky contacts are formed between the interconnect layer and a portion of the mesa surfaces.

In yet another embodiment, Schottky contacts are formed in the active region between the interconnect layer and a portion of the mesa surfaces.

In accordance with another embodiment of the invention, a semiconductor structure is formed as follows. Trenches are formed in a semiconductor region and a shield electrode is formed in each trench. Gate electrodes are formed in a portion of the trenches that form an active region. Each gate electrode is disposed over the shield electrode and is isolated from the shield electrode by an inter-electrode dielectric. An interconnect layer is formed extending over the trenches. The interconnect layer is isolated from the gate electrodes in the active region by a dielectric layer and contacts the shield electrodes in a shield contact region separate from the active region. The interconnect layer contacts mesa surfaces between adjacent trenches in the shield contact region.

In one embodiment, Schottky contacts are formed between the interconnect layer and the mesa surfaces extending between adjacent trenches in the shield contact region. In another embodiment, Schottky contacts are formed between the interconnect layer and a portion of the mesa surfaces extending between adjacent trenches in the shield contact region.

In yet another embodiment, the interconnect layer contacts mesa surfaces between adjacent trenches in the active region. Schottky contacts are formed between the interconnect layer and a portion of the mesa surfaces extending between adjacent trenches in the active region.

The following detailed description and the accompanying drawings provide a better understanding of the nature and advantages of the present subject matter.

BRIEF DESCRIPTION OF THE DRAWINGS

In the drawings, the thicknesses of layers and regions may be exaggerated for clarity. The same reference numerals are used to denote the same elements throughout the drawings.

DETAILED DESCRIPTION

In accordance with embodiments of the present invention improved shielded gate MOSFETs are provided. Some embodiments include shielded gate MOSFET structures with shield contacts in the active regions. Shield contacts in the active regions can reduce shield resistance. Other embodiments include monolithically integrated Schottky diodes and shielded gate MOSFETs that include Schottky diodes in the shield contact regions. Schottky diodes in the shield contact regions can increase the current rating of the die and decrease die size. These and other embodiments of the invention, as well as other features and advantages, are described in more detail below.

Figure 1:
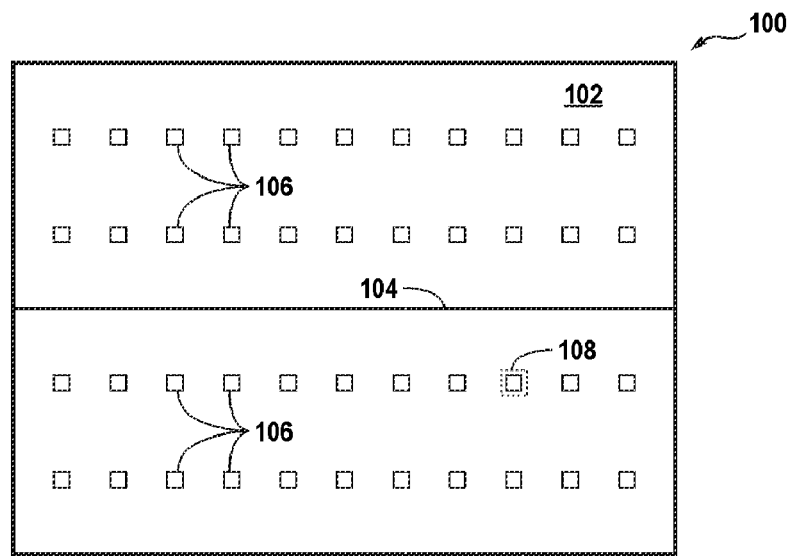
FIG. 1 shows a simplified top view of an exemplary semiconductor die in accordance with an embodiment of the invention.

FIG. 1 shows a simplified top view of an exemplary semiconductor die 100 in accordance with an embodiment of the present invention. It is to be understood that semiconductor die 100 has been simplified for purposes of illustration. For example, the gate pads associated with semiconductor die 100 are not shown. Semiconductor die 100 also includes other parts and regions that are not illustrated but would be known by those of ordinary skill in the art.

Semiconductor die 100 comprises an active region 102 that includes an array of mesas and trenches (shown in FIG. 2) forming active devices. The active devices are configured to conduct current in an ON-state. Semiconductor die 100 may also include a gate runner 104 disposed near the center of active region 102. Gate runner 104 may extend perpendicular to the trenches and contact the gate electrode in each trench. Gate runner 104 can reduce the distance between gate contacts thus reducing gate resistance.

Semiconductor die 100 also includes a plurality of shield contact regions 106. In the exemplary embodiment shown in FIG. 1, shield contact regions 106 are formed periodically within active region 102. As explained more fully below, shield contact regions 106 can provide an area for contact between shield electrodes and an interconnect layer. Contact between shield electrodes and an interconnect layer in shield contact regions 106 can reduce the distance between shield contacts thus reducing shield resistance. A portion 108 of active region 102 and a shield contact region 106 are shown in magnified view in FIG. 2.

Figure 2:
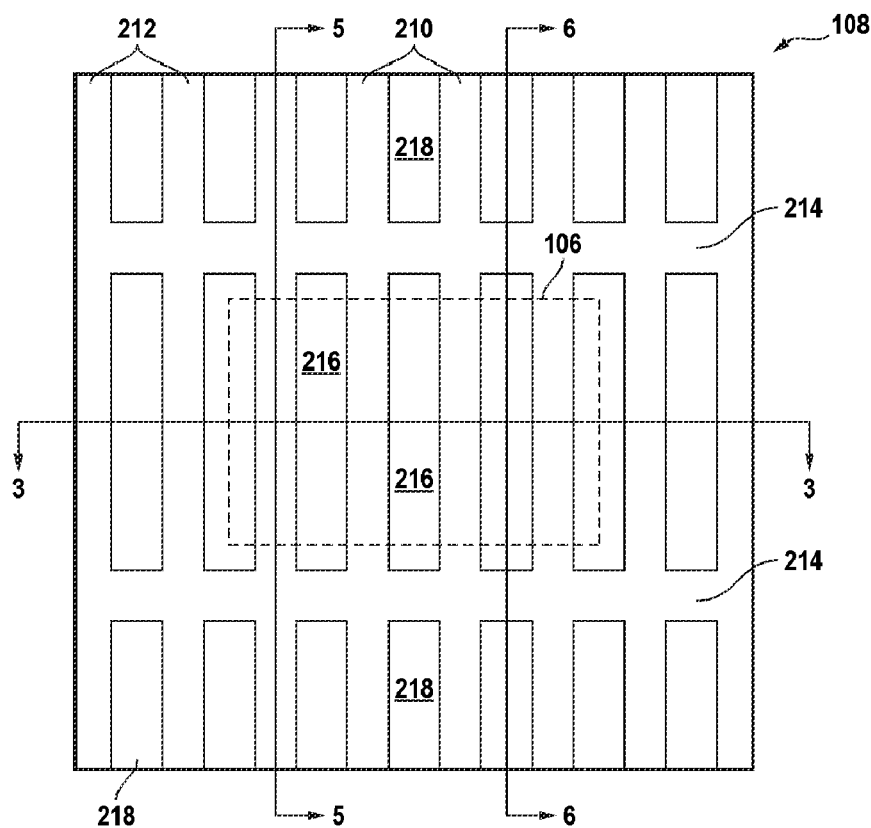
FIG. 2 shows a magnified view of a portion of the exemplary semiconductor die of FIG. 1 in accordance with an embodiment of the invention.

FIG. 2 shows a magnified view of a portion 108 of semiconductor die 100 in accordance with an embodiment of the invention. The area of shield contact region 106 in portion 108 is outlined by a dotted line in FIG. 2. The area inside the dotted line is associated with the shield contact region 106, while the area outside the dotted line is associated with the active region 102 (not labeled in FIG. 2). Trenches 210 extend through the active region 102 and the shield contact region 106. A shield electrode and a gate electrode extend along the portion of each trench 210 that is outside shield contact region 106, while a shield electrode extends along the portion of each trench 210 that is within shield contact region 106. The portion of each trench 210 that is within shield contact region 106 may be referred to as a contact trench. As described below, an interconnect layer can contact the shield electrodes in the portion of trenches 210 that is within shield contact region 106.

FIG. 2 shows trenches 212 that extend through the active region 102. Each trench 212 includes a shield electrode and a gate electrode.

FIG. 2 also shows cross trenches 214 extending substantially perpendicular to trenches 210 and trenches 212. Cross trenches 214 may extend on each side of shield contact region 106 as shown in FIG. 2. Each cross trench 214 includes a gate electrode that contacts the gate electrodes in trenches 210 and trenches 212. Each cross trench 214 also includes a shield electrode that contacts the shield electrodes in trenches 210 and trenches 212. Because the gate electrodes in trenches 210 do not extend through shield contact region 106, the gate electrodes in cross trenches 214 provide contact between the gate electrodes on each side of shield contact region 106. Also, because shield contact regions 106 are not continuous across active region 102, the shield electrodes in cross trenches 214 provide contact to the shield electrodes in trenches 212.

FIG. 2 also shows mesa regions 216 located mostly within shield contact region 106 and mesa regions 218 located outside shield contact region 106. As explained more fully below, Schottky diodes may be formed on mesa regions 216 and mesa regions 218. FIG. 2 provides reference points for a number of cross sections of semiconductor die 100 that will be discussed next.

Figure 3:
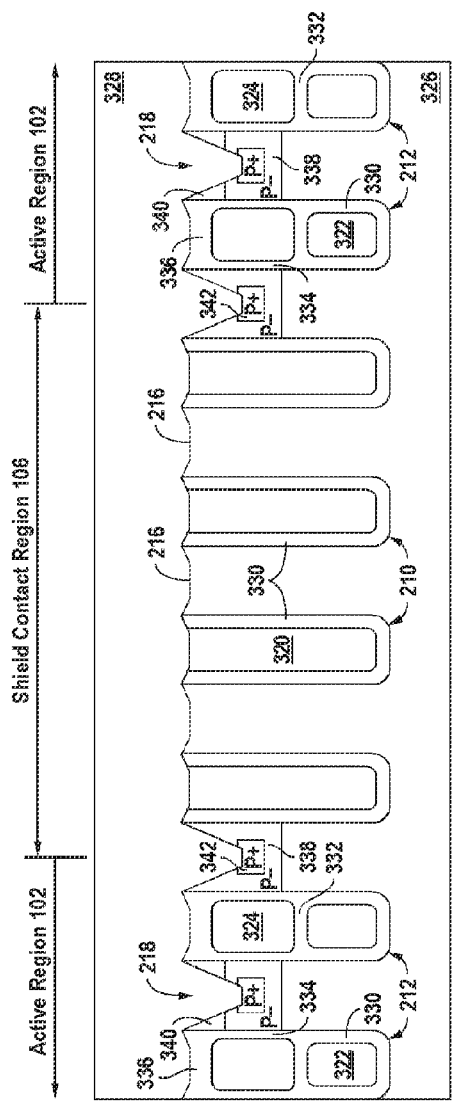
FIG. 3 shows a simplified cross-section view of a portion of the exemplary semiconductor die of FIG. 1 in accordance with an embodiment of the invention.

FIG. 3 shows a simplified cross-section view of a portion of the exemplary semiconductor die 100 of FIG. 1 in accordance with an embodiment of the invention. A portion of shield contact region 106 is shown in the center of FIG. 3, and portions of active region 102 are shown on each side of shield contact region 106. Each of the trenches 210 in shield contact region 106 include a shield electrode 320 insulated from semiconductor region 326 by shield dielectric 330. A top portion of each shield electrode 320 may contact interconnect layer 328. Mesa regions 216 extend between adjacent trenches 210. In an embodiment, interconnect layer 328 may comprise metal and shield contact region 106 may include Schottky diodes disposed between trenches 210. The Schottky diodes include Schottky contacts between semiconductor region 326 and interconnect layer 328 along the surface of mesa regions 216. In an embodiment, a portion of the mesa regions 216 include Schottky diodes. The Schottky contacts may extend along the entire length of mesa regions 216 or along a portion of mesa regions 216. The density of the Schottky diodes may be varied depending on the particular application.

Each of the trenches 212 in active region 102 include a shield electrode 322 in a bottom portion of the trench and a gate electrode 324 in an upper portion of the trench. Shield electrodes 322 are insulated from semiconductor region 326 by shield dielectric 330. As shown in FIG. 3, shield dielectric 330 is recessed in trenches 212 and extends to near the top of trenches 210. An inter-electrode dielectric layer 332 extends between the shield and gate electrodes. A gate dielectric layer 334 extends along the upper sidewalls of trenches 212. A dielectric layer 336 extends over the top of gate electrodes 324 to isolate gate electrodes 324 from interconnect layer 328.

Active region 102 also includes P-type body regions 338 disposed in an upper portion of semiconductor region 326. N-type source regions 340 are disposed over body regions 338. In some embodiments, mesa regions 218 are recessed as shown in FIG. 3, and interconnect layer 328 contacts source regions 340 and P+ type heavy body regions 342 at the surface of mesa regions 218.

Figure 4:
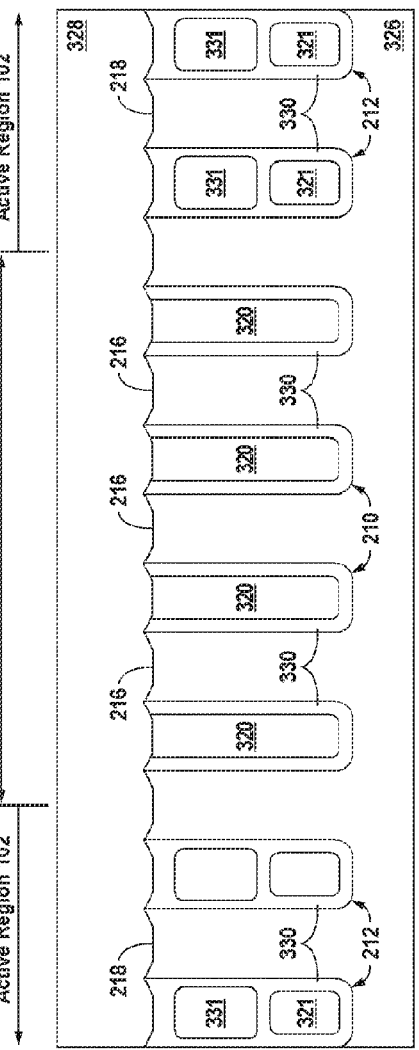
FIG. 4 shows a simplified cross-section view of another portion of the exemplary semiconductor die of FIG. 1 in accordance with an embodiment of the invention.

FIG. 4 shows a simplified cross-section view of another portion of the exemplary semiconductor die 100 of FIG. 1 in accordance with an embodiment of the invention. The cross-section shown in FIG. 4 is taken along the same line as FIG. 3. In the embodiment shown in FIG. 4, interconnect layer 328 comprises metal and active region 102 may include Schottky diodes disposed between a portion of the adjacent trenches 212. The Schottky diodes include Schottky contacts between semiconductor region 326 and interconnect layer 328 along the surface of mesa regions 218. The density of the Schottky diodes may be varied depending on the particular application. As shown in FIG. 4, portions of active region 102 where Schottky diodes are formed may not include body regions, source regions, or heavy body regions. A doped region may be formed, however, for the Schottky contact depending on the particular application.

Figure 5:
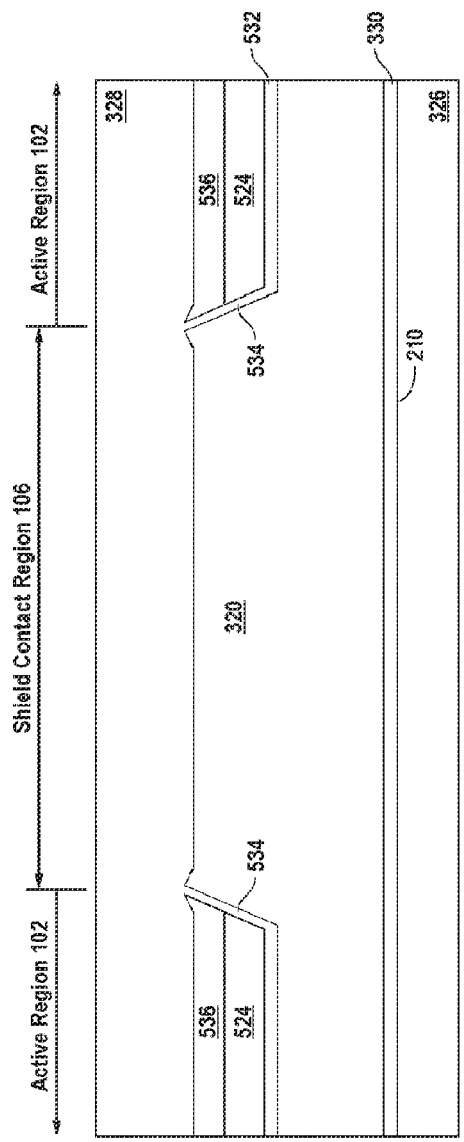
FIG. 5 shows a simplified cross-section view of another portion of the exemplary semiconductor die of FIG. 1 in accordance with an embodiment of the invention.

FIG. 5 shows a simplified cross-section view of another portion of the exemplary semiconductor die 100 of FIG. 1 in accordance with an embodiment of the invention. The cross-section of semiconductor die 100 shown in FIG. 5 extends along a length of a trench 210. Trench 210 extends through contact region 106 and active region 102. FIG. 5 shows semiconductor region 326 extending below trench 210 and shield dielectric 330 extending along the bottom of trench 210. In shield contact region 106, interconnect layer 328 may contact shield electrode 320 along an upper surface of the trench. Alternatively, shield electrode 320 may be recessed and the contact with interconnect layer 328 may be inside the trench. In active region 102, shield electrode 320 extends under gate electrode 524. Gate electrode 524 may be isolated from shield electrode 320 by inter-electrode dielectric layer 532 along the bottom and gate dielectric layer 534 along the side. Gate electrode 524 may be isolated from interconnect layer 328 by dielectric layer 536.

Figure 6:
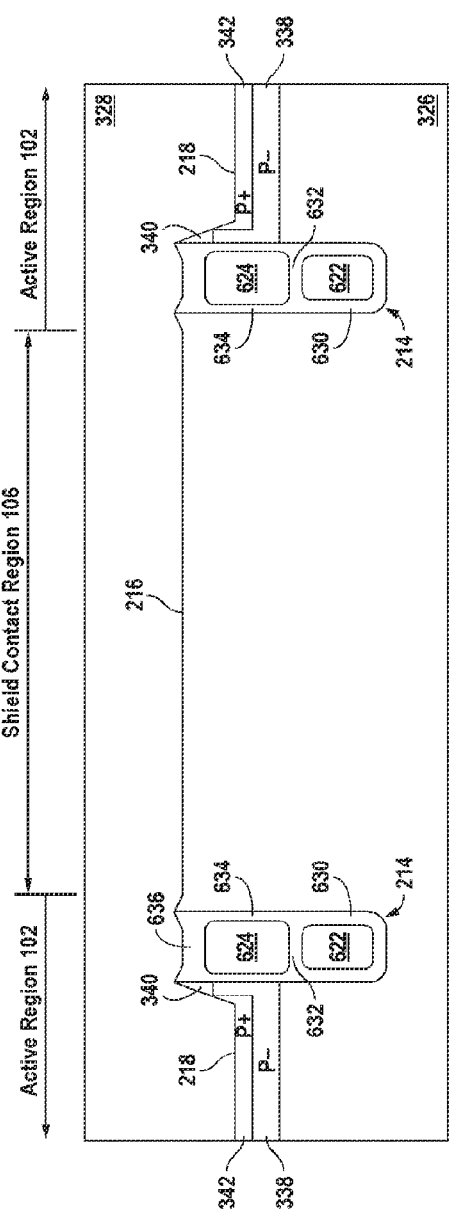
FIG. 6 shows a simplified cross-section view of another portion of the exemplary semiconductor die of FIG. 1 in accordance with an embodiment of the invention.

FIG. 6 shows a simplified cross-section view of another portion of the exemplary semiconductor die 100 of FIG. 1 in accordance with an embodiment of the invention. The cross-section of semiconductor die 100 shown in FIG. 6 extends along mesa region 216 in the shield contact region 106 and along mesa region 218 in active region 102. FIG. 6 shows cross trenches 214 on each side of shield contact region 106. Cross trenches 214 may include shield electrodes 622 disposed in a bottom portion of the trenches and gate electrodes 624 in an upper portion of the trenches. Shield electrodes 622 may be insulated from semiconductor region 326 by shield dielectric 630. Inter-electrode dielectric layer 632 may extend between the shield and gate electrodes. A gate dielectric layer 634 may extend along the sidewalls of trenches 214 between gate electrodes 624 and semiconductor region 326. A dielectric layer 636 may extend over the top of gate electrodes 624 to isolate gate electrodes 624 from interconnect layer 328. Interconnect layer 328 may contact the surface of mesa region 216. As explained above, some embodiments include Schottky diodes disposed along mesa regions 216.

Active region 102 may include body regions 338 disposed in an upper portion of semiconductor region 326 and source regions 340 disposed over body regions 338. Alternatively, some embodiments may include Schottky diodes disposed along mesa regions 218 as explained above and as shown in FIG. 4.

Figure 7:
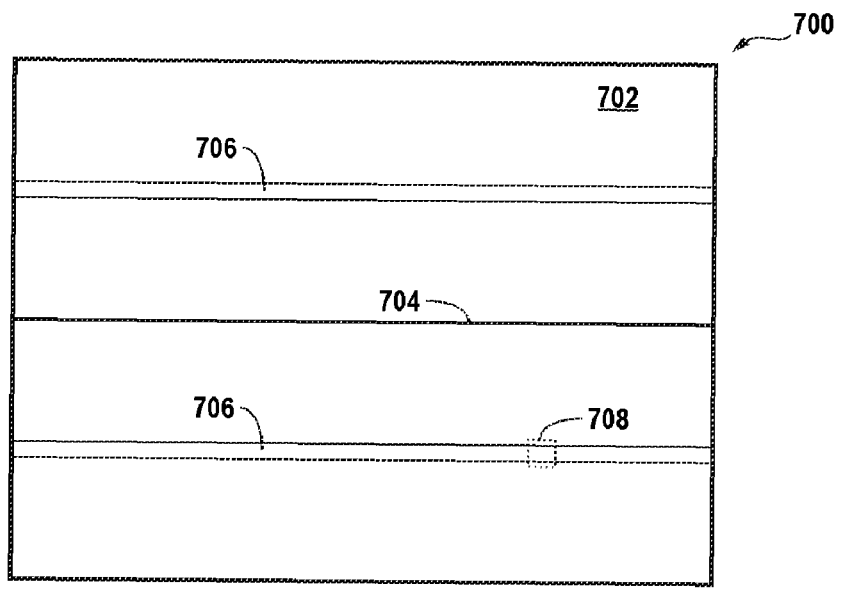
FIG. 7 shows a simplified top view of an exemplary semiconductor die in accordance with another embodiment of the invention.

FIG. 7 shows a simplified top view of an exemplary semiconductor die 700 in accordance with another embodiment of the invention. Semiconductor die 700 comprises an active region 702 that includes an array of mesas and trenches (shown in FIG. 8) forming active devices. The active devices are configured to conduct current in an ON-state. Semiconductor die 700 may also include a gate runner 704 disposed near the center of active region 702. Gate runner 704 may extend perpendicular to the trenches and contact the gate electrode in each trench. Gate runner 704 can reduce the distance between gate contacts thus reducing gate resistance.

Semiconductor die 700 also includes shield contact regions 706. In the exemplary embodiment shown in FIG. 7, shield contact regions 706 extend substantially parallel to gate runner 704 within active region 702. As explained more fully below, shield contact regions 706 can provide an area for contact between shield electrodes and an interconnect layer. Contact between shield electrodes and an interconnect layer in shield contact regions 706 can reduce the distance between shield contacts thus reducing shield resistance. A portion 708 of active region 702 and a portion of one of the shield contact regions 706 are shown in magnified view in FIG. 8.

Figure 8:
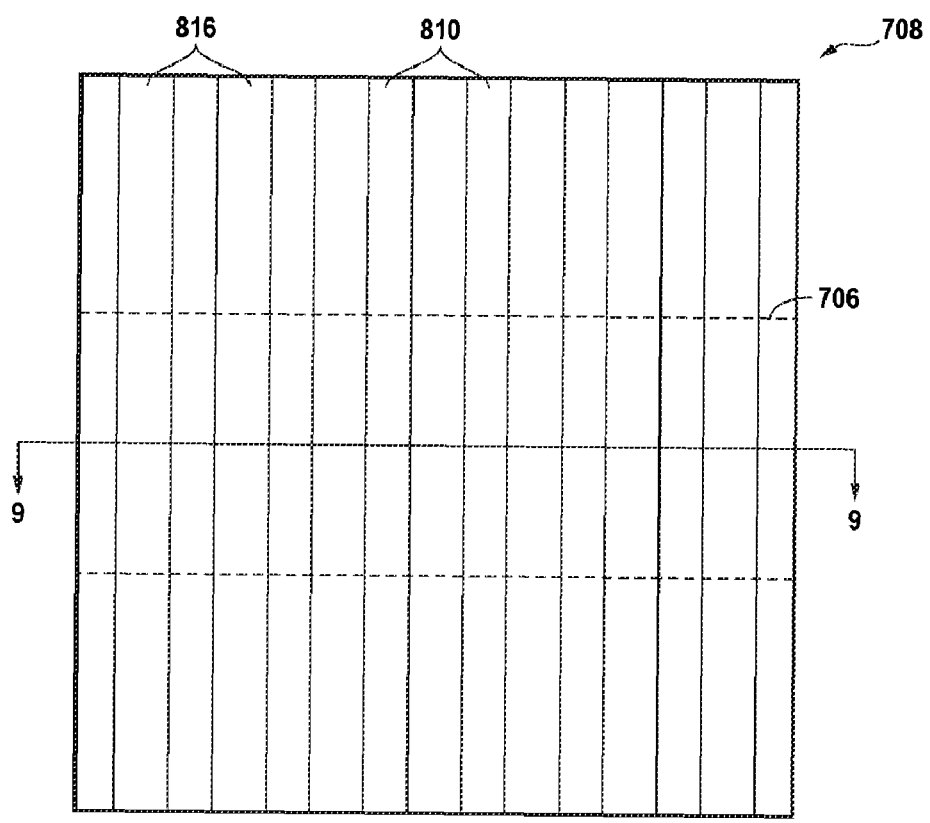
FIG. 8 shows a magnified view of a portion of the exemplary semiconductor die of FIG. 7 in accordance with an embodiment of the invention.

FIG. 8 shows a magnified view of a portion 708 of the exemplary semiconductor die 700 of FIG. 7 in accordance with an embodiment of the invention. The area of shield contact region 706 in portion 708 is outlined by dotted lines in FIG. 8. The area inside the dotted lines is associated with the shield contact region 706, while the area outside the dotted lines is associated with the active region 702 (not labeled in FIG. 8). Trenches 810 extend through the active region 702 and the shield contact region 706. A shield electrode and a gate electrode may extend along the portion of each trench 810 that is outside shield contact region 706, while a shield electrode may extend along the portion of each trench 810 that is within shield contact region 706. An interconnect layer may contact the shield electrodes in trenches 810 in shield contact region 706. Although not shown in the exemplary embodiment of FIG. 8, cross trenches may also be utilized.

FIG. 8 also shows mesa regions 816 extending through active region 702 and shield contact region 706. As explained more fully below, Schottky diodes may be formed on mesa regions 816. FIG. 8 provides reference points for the cross section of semiconductor die 700 that will be discussed next.

Figure 9:
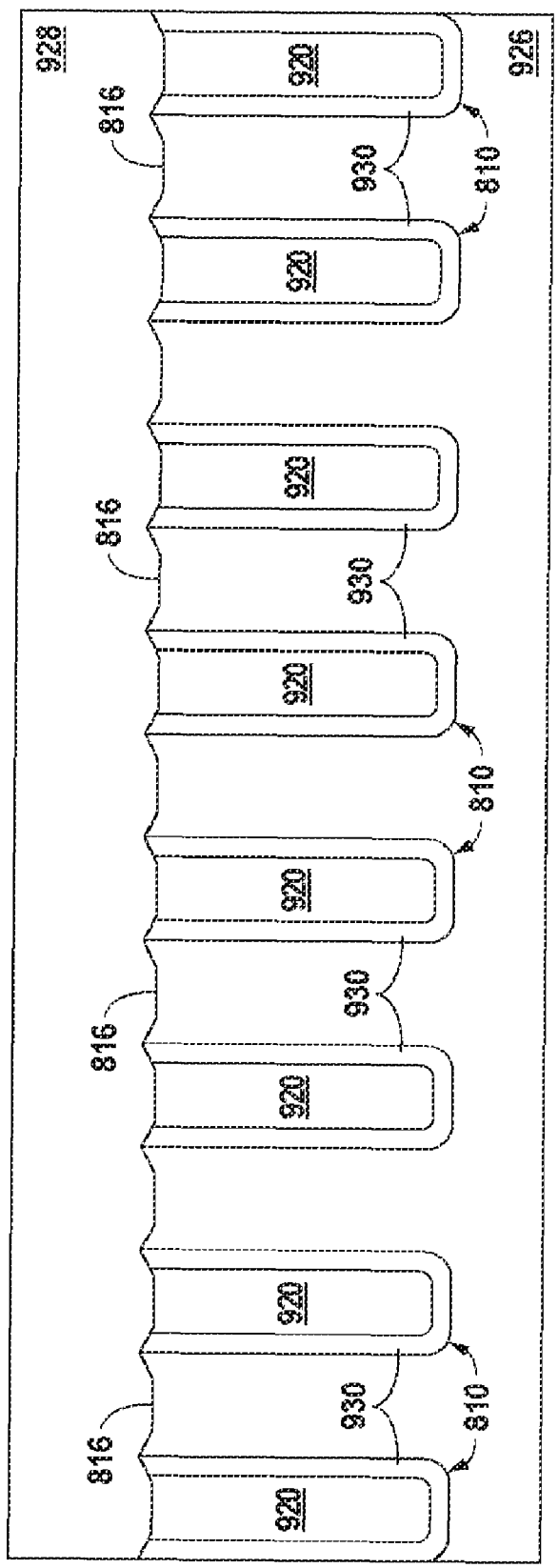
FIG. 9 shows a simplified cross-section view of another portion of the exemplary semiconductor die of FIG. 7 in accordance with an embodiment of the invention.

FIG. 9 shows a simplified cross-section view of a portion of the exemplary semiconductor die 700 of FIG. 7 in accordance with an embodiment of the invention. The cross-section of semiconductor die 700 shown in FIG. 9 extends along shield contact region 706 perpendicular to trenches 810 and mesa regions 816. Each of the trenches 810 in shield contact region 706 may include a shield electrode 920 insulated from semiconductor region 926 by shield dielectric 930. A top portion of each shield electrode 920 may contact interconnect layer 928. Mesa regions 816 may extend between adjacent trenches 810. In an embodiment, interconnect layer 928 may comprise metal and contact region 706 may include Schottky diodes disposed between trenches 810. The Schottky diodes include Schottky contacts between semiconductor region 926 and interconnect layer 928 along the surface of mesa regions 816. In an embodiment, a portion of the mesa regions 816 include Schottky diodes. The Schottky contacts may extend along the entire length of mesa regions 816 or along a portion of mesa regions 816. The density of the Schottky diodes may be varied depending on the particular application.

Figure 10A:
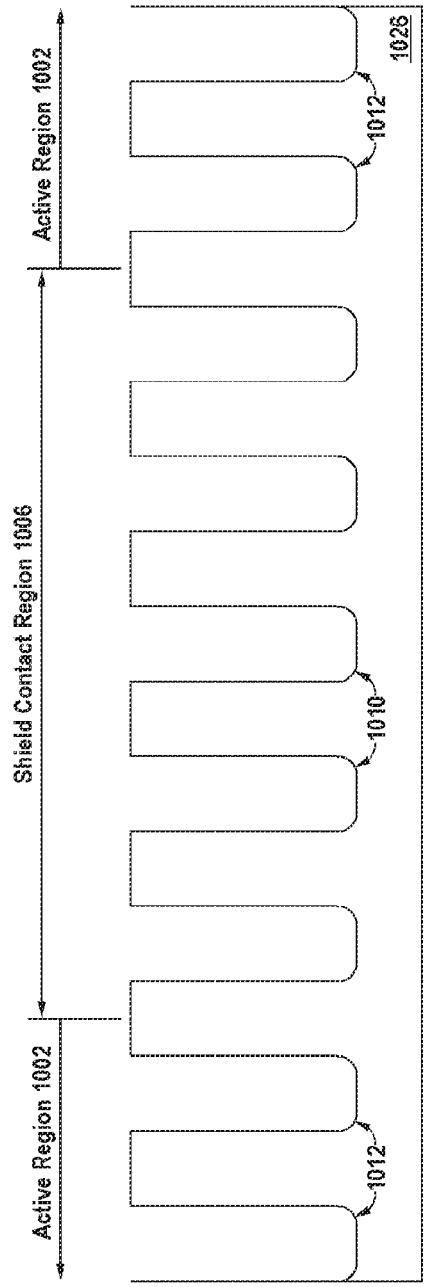
FIGS. 10A-10F show simplified cross-section views at various steps of a process for forming a shielded gate structure in accordance with embodiments of the invention.

FIGS. 10A-10F show simplified cross-section views at various steps of a process for forming a shielded gate structure in accordance with an embodiment of the invention. In FIG. 10A, semiconductor region 1026 is provided as the basis for forming the shielded gate structure. In one embodiment, semiconductor region 1026 includes an N-type epitaxial layer formed over a highly doped N+ type substrate. Trenches 1010 and trenches 1012 can be formed extending into semiconductor region 1026 using any one of a number of known techniques. For example, hardmask and photoresist layers (not shown) may be formed over a surface of semiconductor region 1026 and conventional photolithography and etching techniques may be used to form the trenches.

Figure 10B:
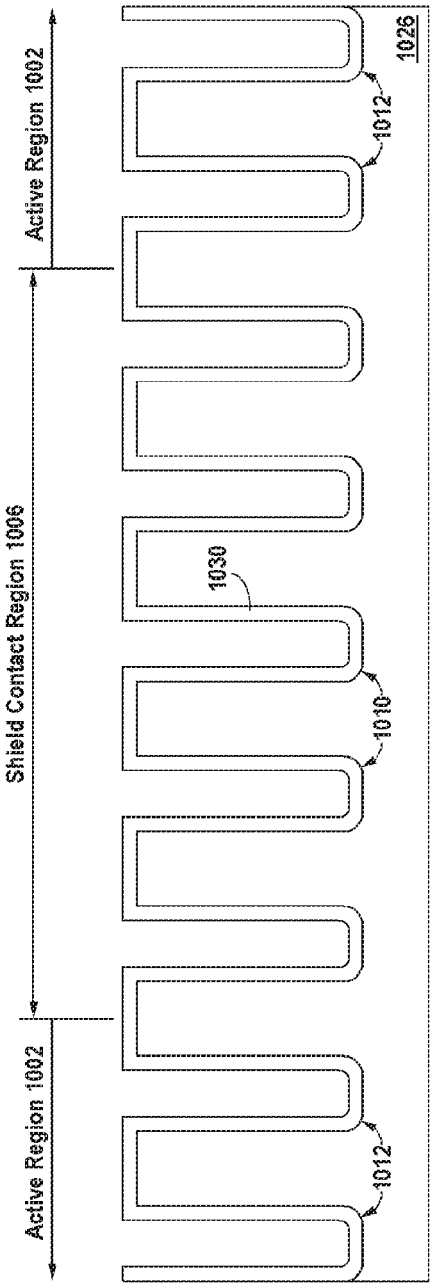

In FIG. 10B, a shield dielectric layer 1030 is formed along the sidewalls and bottom of trenches 1010 and trenches 1012. Shield dielectric layer 1030 may be formed using conventional thermal oxide or chemical vapor deposition (CVD) processes.

Figure 10C:
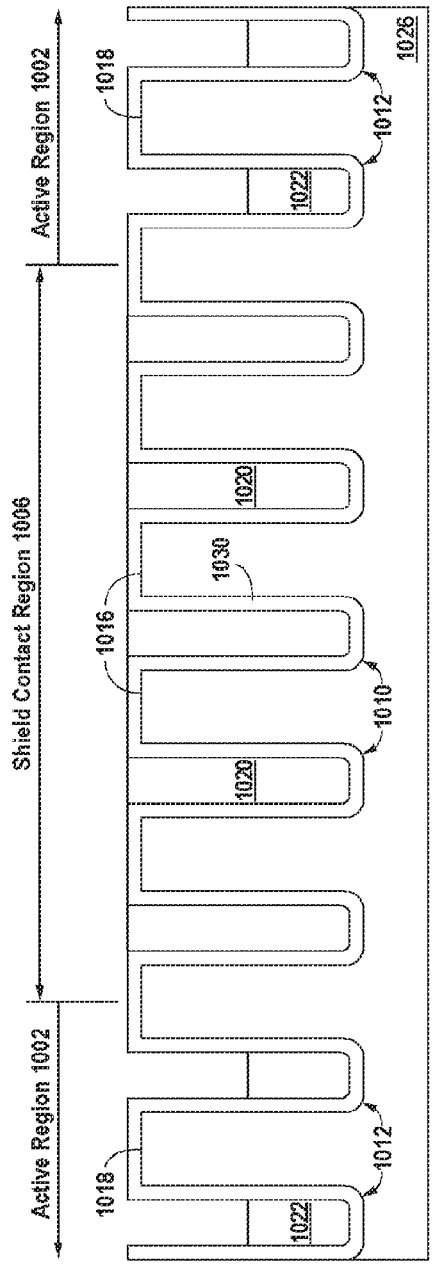

In FIG. 10C, conventional polysilicon deposition and etching techniques may be used to form shield electrodes 1020 in trenches 1010 and shield electrodes 1022 in trenches 1012. For example, a polysilicon layer may be deposited in trenches 1010 and trenches 1012 using a conventional polysilicon deposition process. The polysilicon extending over mesa regions 1016 and mesa regions 1018 may be removed using known etching and/or chemical mechanical polishing (CMP) techniques. In an embodiment, a mask layer (not shown) may be formed over shield contact region 1006 using known techniques (e.g., mask deposition, patterning, etching), and a conventional etching process may be used to recess the polysilicon in trenches 1012 to form shield electrodes 1022. The mask layer may cover shield contact region 1006 during the polysilicon recess etch process.

Figure 10D:
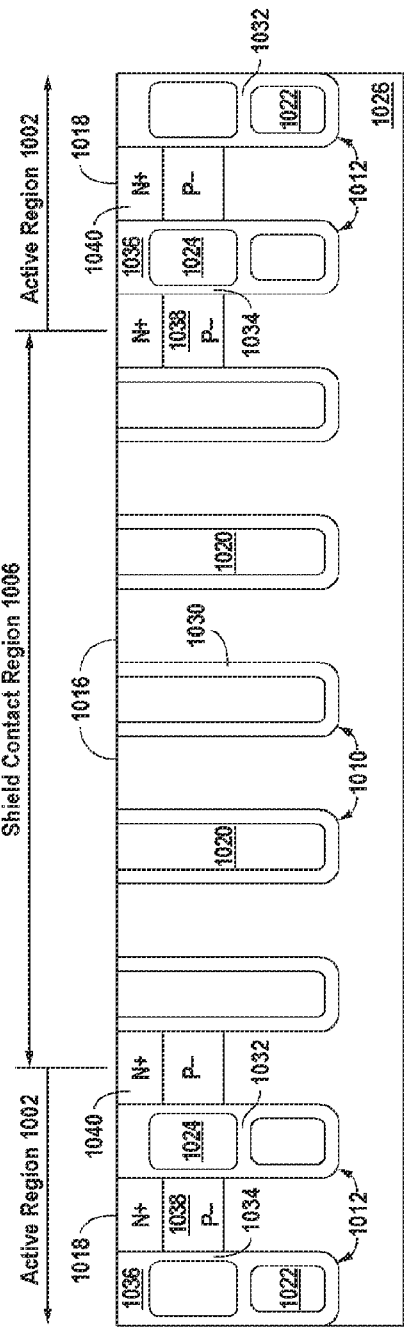

In FIG. 10D, any one of a number of known techniques may be used to form inter-electrode dielectric layer 1032, gate dielectric layer 1034, gate electrode 1024, and dielectric layer 1036 in trenches 1012. Body regions 1038 and source regions 1040 may be formed using conventional implant and diffusion processes. The implants may be blocked from shield contact region 1006 using known masking techniques.

Figure 10E:
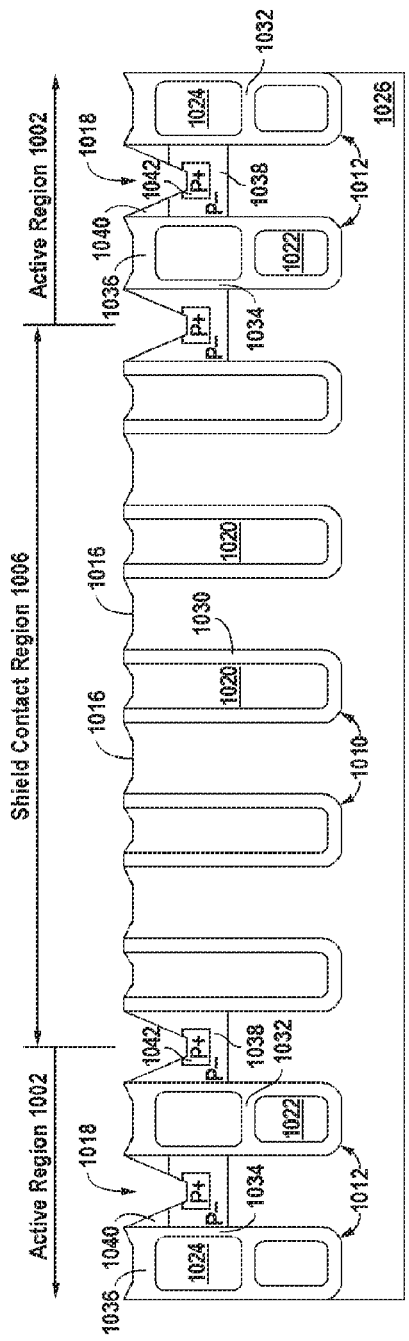

In FIG. 10E, a conventional contact etch process may be used to recess mesa regions 1018 in active region 1002. In an embodiment, known masking techniques may be used to mask shield contact region 1006 during the contact etch process. Heavy body regions 1042 may be formed using conventional implant and diffusion processes. Mesa regions 1016 in shield contact region 1006 may be masked during the heavy body implant process. A second contact etch may be used to remove remaining layers from the shield contact region 1006. An interconnect layer (not shown) may be formed over active region 1002 and shield contact region 1006 using known deposition techniques. The interconnect layer may contact source regions 1040 and heavy body regions 1042 in active region 1002. The interconnect layer may also contact shield electrodes 1020 and mesa regions 1016 in the shield contact region 1006. As explained above, the interconnect layer may comprise metal and Schottky diodes may be formed along one or more of the mesa regions 1016 in the shield contact region 1006 or the mesa regions 1018 in the active region 1002.

Figure 10F:
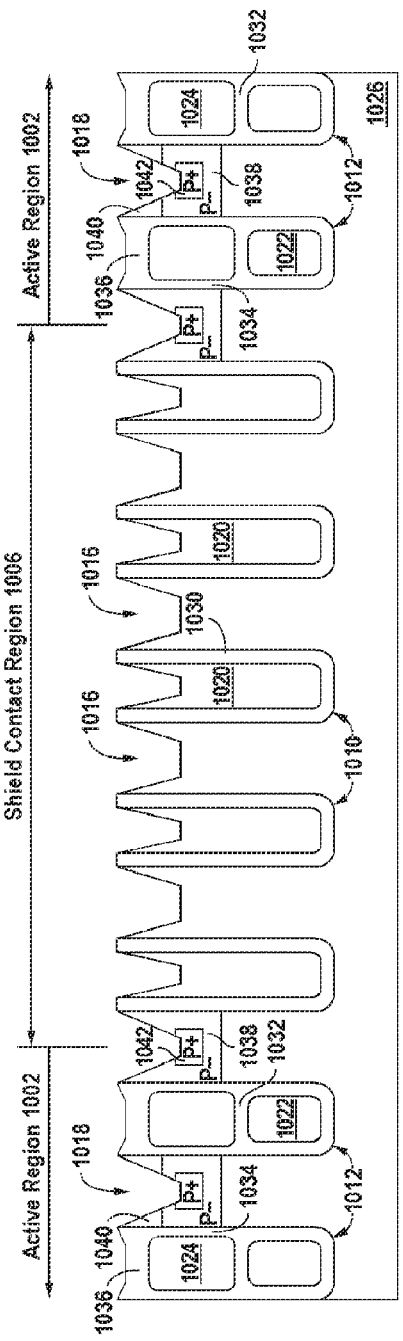

The structure shown in FIG. 10F may be formed using an alternative contact etch process rather than the contact etch process described above with regard to FIG. 10E. The alternative contact etch process may recess mesa regions 1018 in active region 1002 and mesa regions 1016 and shield electrodes 1020 in shield contact region 1006. The alternative contact etch process may use a conventional contact etching process to recess mesa regions 1018 in active region 1002 and to recess mesa regions 1016 and shield electrodes 1020 in shield contact region 1006. Heavy body regions 1042 may be formed using conventional implant and diffusion processes. The implants may be blocked from shield contact region 1006 using known masking techniques. An interconnect layer (not shown) may be formed over active region 1002 and shield contact region 1006 using known deposition techniques. The interconnect layer may contact source regions 1040 and heavy body regions 1042 in active region 1002. The interconnect layer may also contact shield electrodes 1020 and mesa regions 1016 in the shield contact region. As explained above, the interconnect layer may comprise metal and Schottky diodes may be formed along one or more of the mesa regions 1016 in the shield contact region 1006 or the mesa regions 1018 in the active region 1002.

Embodiments of the present invention provide shielded gate structures that enjoy, among other advantages and features, reduced shield resistance (by forming shield contacts within the active region and/or by using cross trenches with the shield contact regions), reduced gate resistance (by using cross trenches with the shield contact regions), increased current rating (by integrating Schottky diodes in the shield contact regions), and reduced die size (by forming shield contacts within the active region and/or by forming Schottky diodes within the shield contact region). Further, embodiments of the present invention provide flexibility in that any number or configuration of shield contact regions may be formed depending on the desired shield resistance for the particular application. Also, any number of Schottky diodes may be formed in the shield contact regions and in the active regions.

While the various embodiments of the invention are mostly described in the context of N-channel shielded gate MOSFETs, these embodiments may be implemented in a variety of other types of devices, such as P-channel shielded gate MOSFETs (i.e., a transistor similar in structure to the MOSFETs described above except that the conductivity type of silicon regions are reversed); N-channel shielded gate IGBTs (i.e., a transistor similar in structure to the MOSFETs described above except that a P-type substrate is used instead of the N-type substrate); P-channel shielded gate IGBTs (i.e., a transistor similar in structure to the MOSFETs describe above but with silicon regions of opposite conductivity type except the substrate is kept N-type); and superjunction variations of the above devices (i.e., devices with columns of alternating conductivity type).

Furthermore, while the various embodiments described above are implemented in conventional silicon, these embodiments and their obvious variants can also be implemented in silicon carbide, gallium arsenide, gallium nitride, diamond, or other semiconductor materials. Additionally, the features of one or more embodiments of the invention may be combined with one or more features of other embodiments of the invention without departing from the scope of the invention.

It should be understood that the above description is exemplary only, and the scope of the invention is not limited to these specific examples. Various alterations, modifications, adaptations, and equivalent arrangements may be made based on the present disclosure and are intended to be within the scope of the invention and the appended claims.

What is claimed is:

1. A semiconductor structure comprising:
    an active region comprising trenches extending into a semiconductor region, each trench including a shield electrode in a bottom portion of the trench, a gate electrode in an upper portion of the trench over the shield electrode, and an inter-electrode dielectric layer extending between the shield electrode and the gate electrode;

a shield contact region surrounded by the active region, the shield contact region comprising at least one contact trench extending into the semiconductor region, wherein the shield electrode from at least one of the trenches in the active region extends along a length of the contact trench; and an interconnect layer extending over the active region and the shield contact region, wherein in the active region the interconnect layer is isolated from the gate electrode in each of the trenches by a dielectric layer and the interconnect layer contacts mesa surfaces of the semiconductor region adjacent to the trenches, and in the shield contact region the interconnect layer contacts the shield electrode and the mesa surfaces of the semiconductor region adjacent to the contact trench.

2. The semiconductor structure of claim 1 wherein at least one of the trenches in the active region extends into the shield contact region and is contiguous with the contact trench.

3. The semiconductor structure of claim 1 wherein at least one of the trenches in the active region does not extend into the shield contact region.

4. The semiconductor structure of claim 1 wherein each of the trenches in the active region extends in a first direction, the active region further comprising at least one cross trench extending substantially perpendicular to the trenches, wherein a gate electrode in the cross trench is contiguous with the gate electrode in at least one of the trenches.

5. The semiconductor structure of claim 1 wherein the shield electrode in the shield contact region extends from a bottom portion of the contact trench to an upper portion of the contact trench.

6. The semiconductor structure of claim 1 wherein in the shield contact region the interconnect layer contacts the mesa surfaces of the semiconductor region adjacent to the contact trench to form Schottky contacts therebetween.

7. The semiconductor structure of claim 1 wherein the shield contact region comprises a plurality of contact trenches separated by the mesa surfaces of the semiconductor region, and wherein Schottky contacts are formed between the interconnect layer and a portion of the mesa surfaces.

8. The semiconductor structure of claim 1 wherein in the active region Schottky contacts are formed between the interconnect layer and a portion of the mesa surfaces.

9. The semiconductor structure of claim 1 wherein the active region further comprises a body region in the semiconductor region and a source region in the body region adjacent each trench.

10. A semiconductor structure comprising:

first and second active regions each comprising trenches extending into a semiconductor region, wherein each trench includes a shield electrode in a bottom portion of the trench, a gate electrode in an upper portion of the trench over the shield electrode, and an inter-electrode dielectric layer extending between the shield electrode and the gate electrode;

a shield contact region between the first and second active regions, the shield contact region comprising at least one contact trench extending into the semiconductor region, wherein the shield electrode from at least one of the trenches in the first active region extends along a length of the contact trench; and an interconnect layer extending over the first and second active regions and the contact region, wherein in the first and second active regions the interconnect layer is isolated from the gate electrode in each of the trenches by a dielectric layer and the interconnect layer contacts mesa surfaces of the semiconductor region adjacent to the trenches, and in the shield contact region the interconnect layer contacts the shield electrode and the mesa surfaces of the semiconductor region adjacent to the contact trench.

11. The semiconductor structure of claim 10 wherein at least one of the trenches in the first active region extends into the shield contact region and is contiguous with the contact trench.

12. The semiconductor structure of claim 10 wherein the shield electrode in the shield contact region extends from a bottom portion of the contact trench to an upper portion of the contact trench.

13. The semiconductor structure of claim 10 wherein in the shield contact region the interconnect layer contacts the mesa surfaces of the semiconductor region adjacent to the contact trench to form Schottky contacts therebetween.

14. The semiconductor structure of claim 10 wherein the shield contact region comprises a plurality of contact trenches separated by the mesa surfaces of the semiconductor region, and wherein Schottky contacts are formed between the interconnect layer and a portion of the mesa surfaces.

15. The semiconductor structure of claim 10 wherein in the first active region Schottky contacts are formed between the interconnect layer and a portion of the mesa surfaces.

16. The semiconductor structure of claim 10 wherein the first and second active regions further comprises body regions in the semiconductor region and source regions in the body regions adjacent each trench.

* * * * *